United States Patent
Wattyn

(10) Patent No.: US 12,393,120 B2
(45) Date of Patent: Aug. 19, 2025

(54) APPARATUS AND METHOD FOR TREATING A RELIEF PRECURSOR WITH REDUCED CLEANING

(71) Applicant: XSYS PREPRESS N.V., Ypres (BE)

(72) Inventor: Bart Marc Luc Wattyn, Dentergem (BE)

(73) Assignee: XSYS PREPRESS N.V., Ypres (BE)

( * ) Notice: Subject to any disclaimer, the term of this patent is extended or adjusted under 35 U.S.C. 154(b) by 246 days.

(21) Appl. No.: 17/923,322

(22) PCT Filed: May 5, 2021

(86) PCT No.: PCT/EP2021/061894
§ 371 (c)(1),
(2) Date: Nov. 4, 2022

(87) PCT Pub. No.: WO2021/224342
PCT Pub. Date: Nov. 11, 2021

(65) Prior Publication Data
US 2023/0236510 A1    Jul. 27, 2023

(30) Foreign Application Priority Data
May 6, 2020 (NL) .................................. 2025512

(51) Int. Cl.
*G03F 7/30* (2006.01)
(52) U.S. Cl.
CPC .................. *G03F 7/3057* (2013.01)
(58) Field of Classification Search
CPC .......................... G03F 7/3057; B41C 2210/06
See application file for complete search history.

(56) References Cited

U.S. PATENT DOCUMENTS 5,686,231 A * 11/1997 Kasakura ............. B01D 61/145
430/398
5,822,641 A * 10/1998 Furukawa ............ G03D 13/002
396/575
(Continued)

FOREIGN PATENT DOCUMENTS

JP    2000250228 A    9/2000
JP    2009229944 A    10/2009
(Continued)

OTHER PUBLICATIONS

International Search Report and Written Opinion dated Aug. 20, 2021, for Application No. PCT/EP2021/061894 (15 pages).
(Continued)

*Primary Examiner* — David H Banh
(74) *Attorney, Agent, or Firm* — KDW Firm PLLC

(57) ABSTRACT

An apparatus for treating a relief precursor such as a printing plate precursor, with a liquid includes a treatment compartment with treatment means configured to treat a relief plate precursor with a liquid and to remove pieces from the relief precursor, and a liquid collection system configured to receive liquid and removed pieces from the treatment means. The liquid collection system is configured to separate pieces having dimensions larger than predefined minimum dimensions from the liquid and to allow at least some of said pieces to be dissolved at least partially in the liquid at least when the liquid is in a static state after or before a treatment of the relief precursor with the treatment means.

21 Claims, 7 Drawing Sheets

(56) References Cited

U.S. PATENT DOCUMENTS

| | | | |
|---|---|---|---|
| 5,930,547 A * | 7/1999 | Stein | G03F 7/3071 |
| | | | 396/626 |
| 6,270,267 B1 | 8/2001 | Ogawa | |
| 2004/0173463 A1 | 9/2004 | Itoh et al. | |
| 2012/0115091 A1* | 5/2012 | Suzuki | B01D 29/56 |
| | | | 430/449 |
| 2013/0071786 A1* | 3/2013 | Oohashi | G03F 7/092 |
| | | | 524/557 |
| 2013/0105327 A1* | 5/2013 | Kasuya | C23G 3/028 |
| | | | 205/82 |
| 2015/0352470 A1 | 12/2015 | Danon | |
| 2016/0018778 A1* | 1/2016 | Matsuoka | B01D 15/203 |
| | | | 210/660 |
| 2019/0072856 A1* | 3/2019 | Vervloet | G03F 7/32 |
| 2019/0278183 A1 | 9/2019 | Swihart et al. | |
| 2020/0192226 A1* | 6/2020 | Shirakawa | G03F 7/3042 |
| 2022/0291588 A1* | 9/2022 | Tajima | G03F 7/32 |

FOREIGN PATENT DOCUMENTS

| | | |
|---|---|---|
| JP | 2011033773 A | 2/2011 |
| WO | 2013099797 A1 | 7/2013 |
| WO | 2019044319 A1 | 3/2019 |
| WO | 2019206911 A1 | 10/2019 |

OTHER PUBLICATIONS

European Communication pursuant to Rule 114(2) EPC for European Patent Application No. 21724617.2, 17 pages.

* cited by examiner

APPARATUS AND METHOD FOR TREATING A RELIEF PRECURSOR WITH REDUCED CLEANING

This application is a national stage filing under 35 U.S.C. 371 of pending International Application No. PCT/EP2021/061894, filed May 5, 2021, which claims priority to Netherlands Patent Application No. 2025512, filed May 6, 2020, the entirety of which applications are incorporated by reference herein.

FIELD OF INVENTION

The field of the invention relates to an apparatus and a method for treating a relief precursor, in particular a relief plate precursor such as a printing plate precursor, with a liquid. Particular embodiments relate to an apparatus and a method for treating a relief precursor with a solvent in order to remove uncured material and generate a relief structure.

BACKGROUND

Washer apparatus for printing plate precursors are known. Typically, a transport bar is used to move a printing plate precursor through such a washer apparatus using a transport system. The washer further uses a liquid to partially remove material from the precursor and in most cases brushes are used to increase the efficiency. These brushes are wetted with the liquid using pumps and/or other delivery devices to constantly wet the brushes with liquid. In order to protect the pumps from getting damaged by foreign matter (e.g. screws, particles, bristles, etc.) sieve like protection means are used to retain such matter. These sieve like protection means require frequent cleaning, e.g. every week, in order to not getting clogged.

SUMMARY

The object of embodiments of the invention is to provide an apparatus and method which reduce cleaning requirements and related clogging problems.

According to a first aspect of the invention there is provided an apparatus for treating a relief precursor, such as a printing plate precursor, with a liquid. The apparatus comprises a treatment compartment and a liquid collection system. The treatment compartment has a treatment means configured to treat a relief precursor with a liquid and to remove pieces from the relief precursor. The liquid collection system is configured to receive liquid and removed pieces from the treatment means, to separate pieces having dimensions larger than predefined minimum dimensions from the liquid and to allow at least some of said pieces to be dissolved at least partially in the liquid at least when the liquid is in a static state after or before a treatment of the relief precursor with the treatment means.

The pieces which are separated from the liquid in the liquid collection system will be mainly pieces removed from the relief precursor, e.g. cured and/or non-cured particles, residues, film portions or flocs, but may also comprise any other undesirable part such as a screw or a nut or a bristle, which has accidently become loose and which has been carried away by the liquid. However, typically only the pieces removed from the relief precursor, or a portion thereof will be dissolved in the liquid. By configuring the liquid collection system such that pieces are at least partially dissolved in the liquid, it has been found that the frequency for cleaning can be reduced significantly.

In prior art systems removed pieces tend to get trapped in sieve means and dry out when the apparatus is not in operation. By configuring the liquid collection system to allow at least some of the pieces to be dissolved at least partially in the liquid at least when the liquid is in a static state after or before a treatment of the relief precursor with the treatment means, and not only during operation of the treatment means, the amount of pieces that can cause clogging can be significantly reduced.

It is noted that a non-operational state of the apparatus or of the treatment means, refers to a state where liquid is present in the apparatus, but where the liquid is not being circulated through the treatment compartment.

According to a preferred embodiment, the liquid collection system is configured to maintain a majority of the separated pieces, and preferably at least 80% of the separated pieces, more preferably at least 90% of the separated pieces, in a state wetted with the liquid, both when the treatment means are operational and non-operational. By keeping the majority of the separated pieces in a wetted state, also when the treatment means is not in operation, the risk of pieces drying and causing clogging can be reduced or avoided.

According to an exemplary embodiment, the liquid collection system is configured to maintain a majority of the separated pieces, and preferably at least 80% of the separated pieces, more preferably at least 90% of the separated pieces, in a submerged state in the liquid, both when the treatment means are operational and non-operational.

Preferably, the liquid collection system is part of a liquid circulation system configured to circulate the collected liquid back to the treatment means. The liquid or a portion thereof may be recirculated directly to the treatment compartment without being cleaned or otherwise treated, and/or the liquid coming from the liquid collection system, or a portion thereof, may be sent to a separate device for being cleaned or otherwise treated, e.g. in a distillation apparatus, before being returned to the treatment compartment. In addition to the distilled or cleaned liquid portions of the liquid, ingredients may added in order to adjust their concentrations to the desired levels.

In a preferred embodiment the liquid collection system comprises a sieve means. Preferably, the sieve means is at least partially submerged in the liquid, also when the liquid is in a static state.

Surprisingly it was found that when the sieve means are submerged in the liquid the frequency for cleaning can drastically be reduced. However, it is also possible to use a non-submerged sieve means which is configured to ensure that the majority of separated pieces are removed from the sieve means and submerged in the liquid.

Preferably, the liquid collection system comprises a container for storing the sieved liquid, and the sieve means is arranged in the container so that it is submerged at least when the liquid is in a static state after or before a treatment of the relief precursor with the treatment means. Preferably, the container is a large volume container capable of storing more than 20 litre, more preferably more than 30 litre, e.g. more than 50 litre or even more than 100 litre.

In a possible embodiment, the sieve means comprises a sieve plane oriented at an angle of at least 30° with respect to a horizontal direction, preferably vertically. In that manner any pieces stopped by the sieve means will tend to move downward, clearing the sieve means and reducing the risk of clogging.

In an exemplary embodiment, the sieve means comprises any one or more of: a wire mesh, a grid, a plate with a plurality of holes. The sieve means are made of a material stable in the liquid.

Preferably, the sieve means have openings with dimensions in the range smaller than 5 mm, preferably 0.1 mm to 3 mm, more preferably 0.5 mm to 2 mm. More in particular, preferably, the sieve means are dimensioned to stop any pieces that may cause damage to pumps or other components of the liquid circulation system.

In a preferred embodiment, the sieve means is integrated in a basket. In that manner a compact sieve means may be obtained. For example, the peripheral wall may form a sieve means and/or the bottom may form a sieve means. In particular when the bottom forms a sieve means, preferably at least the bottom is submerged in a static state of the liquid. Preferably, the basket is removably arranged in a container holding an amount of liquid, wherein at least the bottom is submerged in the liquid.

In another possible embodiment, the basket is provided with a closed bottom tray configured for holding an amount of liquid, also in a static state of the liquid, and with a peripheral portion forming the sieve means. In such an embodiment, a portion of the pieces stopped by the sieve means will fall downward in the closed bottom portion and thus in the liquid contained in the tray so that they can be dissolved in the liquid, also when no liquid is circulated in the machine. In that manner a relatively small amount of liquid in the tray is sufficient to ensure that the pieces are at least partially dissolved and the sieve means do not have to be submerged.

Preferably, the sieve means is removable. In that manner, the sieve means may be removed for cleaning, even though this will typically not be required very often.

Preferably, the sieve means is made of a metal, an alloy, a plastic, a glass, a ceramic, paper, natural fibres or combinations thereof. Preferably the sieve means is made from a woven or nonwoven form of fibres, filaments or wires.

Preferably, the liquid collection system, and in particular the sieve means, is configured not to absorb or adsorb the pieces. In this way it is avoided that the pieces get trapped in the liquid collection system.

Preferably, the sieve means is configured to hold back pieces having a largest dimension larger than 5 mm, preferably larger than 3 mm, more preferably larger than 2 mm.

In an exemplary embodiment, the treatment means comprises one or more pre-washing members and one or more main washing members downstream of the pre-washing members, and the sieve means comprises a first sieve means receiving liquid used by the pre-washing members and a second sieve means receiving liquid used by the main washing members. In this manner, two liquid circulation flows can be distinguished: a first flow for performing a pre-washing step and a second flow for performing a main washing step. The first sieve means and/or the second sieve means may be at least partially submerged in the liquid. Preferably, at least the first sieve means is at least partially submerged in the liquid both during and after treatment. Typically, during pre-washing many pieces, such as particles and film portions from laser ablation masks and photopolymer residues, are removed from the relief precursor, and by having an at least partially submerged sieve means for this flow, the cleaning frequency of the sieve means can be decreased.

The first sieve means may be arranged in a first storage container. The second sieve means may be arranged in a second storage container. Preferably, the second storage container is larger than the first storage container. The first container may have a volume larger than 20 litre, or even larger than 30 litre, e.g. between 35 litre and 100 litre. The second container may have a volume larger than 50 litre, or larger than 100 litre or even larger than 200 litre, e.g. between 200 and 600 litre.

Preferably, the liquid collection system is further configured for carrying liquid that has passed through the first sieve means to an outlet and for recirculating liquid that has passed through the second sieve means directly to the treatment means. In that manner the liquid used for the pre-washing, typically comprising dissolved material from the relief precursor, may be treated outside the apparatus before being re-used. For example, the liquid used for the pre-washing may be carried to a distillation apparatus to remove polymer material.

According to an exemplary embodiment, the apparatus further comprises liquid transport means configured to cause a pre-washing flow of at least 0.3 litre per minute, preferably at least 0.6 litre per minute through the first sieve means and, a main washing flow of at least 10 litre per minute, preferably at least 30 litre per minute through the second sieve means.

Preferably, the treatment means further comprises one or more cleaning members downstream of the one or more main washing members. The treatment compartment may then be provided with an inlet for fresh liquid which is arranged such that the fresh liquid is used by the one or more cleaning members.

In an exemplary embodiment, the apparatus further comprises a transport system configured to move the relief precursor through the treatment compartment. Preferably, the transport system comprises at least one transport bar provided with a coupling portion configured to be coupled to the relief precursor and the transport system is configured to transport the transport bar through the treatment compartment.

Preferably, the transport bar is provided with at least one penetration element, more preferably a plurality of penetration elements. The shape of the at least one penetration element may be selected from a group comprising: a rod with e.g. a round, elliptical, triangular, rectangular or multi-angular cross section, a blade, a needle, or combinations thereof. The at least one penetration element may be made of metal or an alloy.

Preferably, the length of the transport bar is from 100 mm to 10000 mm, more preferably from 200 mm to 5000 mm, most preferably from 500 mm to 3000 mm.

In a preferred embodiment, the transport system is substantially symmetric with respect to a central axis of the apparatus, with a first and second transport mechanism for being coupled to a first and second outer end of the transport bar, respectively. Although such symmetric set-up is generally preferred, it is noted that there may be provided a driven transport mechanism at the first outer end of the transport bar and a simple guide mechanism at the second outer end of the transport bar.

Preferably, the transport system comprises a lead screw, preferably a pair of lead screws, or a chain or belt, preferably a pair of chains or belts. Such lead screw or chain or belt extends in the movement direction, one side of the treatment compartment or on either side of the treatment compartment.

According to a preferred embodiment, the apparatus comprises a plate coupling station and/or decoupling station configured for coupling and/or decoupling the relief precursor to or from the transport bar. The plate coupling station may be configured to engage the at least one penetration element in an area near an edge of a relief precursor. More preferably, each penetration element has a sharp tip or edge capable of causing a penetrating action in the material of the relief precursor, and the plate coupling station is configured to cause a penetration by the at least one penetration element at least partially into or through an unperforated area near an edge of a relief precursor. In that manner the penetration elements are pushed in the material of the printing plate without generating waste. However, it is noted that the invention also covers the use of pre-perforated relief precursors which are coupled to the transport bar in the plate coupling station.

Preferably, the transport system is configured to move the at least two transport bars in a closed loop through the apparatus. Two, three or more transport bars may be transported simultaneously in the apparatus. For example, one of the at least two transport bars may be transported through the treatment compartment whilst another one is being transported back to the plate coupling station.

The treatment means may comprise rollers, brushes, spraying nozzles, pipes, a table arranged below a roller or brush, and combinations thereof. Preferably the liquid application means are rollers or cylindrical brushes. The brush may be e.g. a movable (rotating or oscillating) brush (flat or cylindrical).

Preferably, the liquid application means comprises a shaft and a liquid application tool intended to contact the relief precursor, such as bristles, arranged on the shaft, and the liquid evacuation part extends below the transport bar and below the shaft of the liquid application means, at a distance of the liquid application tool. In that manner the liquid evacuation part will not hinder the treatment by the liquid application tool, whilst allowing a good evacuation of any liquid on the transport bar.

In addition the apparatus may comprise a protection system to prevent contamination of the transport system with liquid. The protection system is configured to guide and evacuate the liquid such that the transport system is protected against wetting with the liquid of the treatment compartment. Preferably, the protection system comprises a liquid evacuation part extending lengthwise next to the transport system and below an outer end of the transport bar. The liquid evacuation part is provided with an upwardly extending portion at a side facing the transport system. In that manner, the upwardly extending portion will stop liquid flowing over the liquid evacuation part towards the transport system. The other side of the liquid evacuation part which is furthest away from the transport system may extend horizontally or downwardly so that the liquid can be evacuated into a reservoir below the liquid evacuation part. However, it is also possible that the liquid evacuation part consists of the upwardly extending portion only, e.g. an upwardly sloping portion and that this portion alone guides the liquid to a reservoir.

Preferably, the transport bar is provided at the outer end with an upwardly extending portion. In such an embodiment, the upwardly extending portion of the liquid evacuation part extends between the transport system and the upwardly extending portion of the transport bar. In that manner, liquid present on the transport bar will be stopped by the upwardly extending portion of the transport bar, and can flow sideways off the transport bar on the liquid evacuation part where liquid is evacuated to a reservoir as described above.

Preferably, the treatment compartment comprises a wall portion having a lower edge right above the outer end of the transport bar, when the transport bar moves through the treatment compartment. More preferably, the wall portion extends next to the upwardly extending portion of the transport bar such that an upper edge of the upwardly extending portion of the transport bar is higher than the lower edge of wall portion. Also preferably, the liquid evacuation part extends below the lower edge of the wall portion. In that manner, any liquid splashes or drops on the wall portion of the treatment compartment may glide along the wall portion onto the evacuation part or on the transport bar, such that those splashes or drops are evacuated, and are prevented form wetting the transport system. The wall portion may comprise openings configured to allow components of the liquid application means, such as a shaft, to penetrate through the wall portion. The wall portion is typically an upright wall portion, preferably a vertical wall portion.

The apparatus may further comprise additional components selected form the group comprising: a pump, a filter, a sensor (temperature, solid content, density, pressure, etc.), a gear, a motor, a spraying system, a control unit configured to control one or more components thereof, and combinations thereof.

The apparatus according to any one of the claims, further comprising a control unit configured to control the components.

According to another aspect of the invention there is provided a method for treating a relief precursor (P) with a liquid, comprising the steps of:
  treating a relief precursor with a liquid and to remove pieces from the relief precursor;
  collecting liquid and removed pieces, separating pieces having dimensions larger than predefined minimum dimensions from the liquid and allowing at least some of said pieces to be dissolved at least partially in the liquid by keeping them in the liquid at least after the treating.

Preferably, a majority of the separated pieces, and preferably at least 80% of the separated pieces, more preferably at least 90% of the separated pieces, are maintained in a state wetted with the liquid, both during treatment and after treatment. More preferably, a majority of the separated pieces, and preferably at least 80% of the separated pieces, more preferably at least 90% of the separated pieces, are maintained in a submerged state in the liquid, both during treatment and after treatment.

According to an exemplary embodiment, a sieve means is used for performing the separating step and the separated pieces are not absorbed or adsorbed on the sieve means. In that way the risk of having pieces sticking to the sieve means is reduced or avoided.

Preferably, the sieve means is arranged in a container for storing the sieved liquid so that the sieve means is submerged at least when the liquid is in a static state after or before the treating of the relief precursor.

In an exemplary embodiment, the treating comprises a pre-washing step followed by a main washing step. For example, during the pre-washing step, carbon and polymer pieces may be removed and during the main washing step pieces, preferably without carbon, may be removed, said pieces preferably having average dimensions smaller than the average dimensions of the pieces removed during the pre-washing step.

In an exemplary embodiment, liquid used during the pre-washing step is sent through a first sieve means which is at least partially submerged in the liquid during and after the pre-washing step. The first sieve means may be arranged in a first storage container. Optionally, liquid used during the main washing step is sent through a second sieve means which may be at least partially submerged in the liquid during and after the main washing step. The second sieve means may be arranged in a second storage container. The liquid used during the pre-washing step may be carried to an outlet and the liquid used for the main washing step may be recirculated directly, via the optional second sieve means, and used for the treating step.

Optionally, the treating further comprises a cleaning step after the main washing step using fresh liquid. The fresh liquid may be liquid recuperated at the outlet and cleaned in a separate device.

In a preferred embodiment, the method further comprises coupling the relief precursor to a transport bar and moving the transport bar with the coupled relief precursor during the treating step.

Preferably, the treatment during the treating step is selected from the group comprising washing, brushing, rinsing, spraying, optionally in combination with any one of the following: developing, heating, cooling, removing of material, treating with gases or liquids, with electromagnetic waves, and combinations thereof.

The method may further comprise the step of performing a post-treatment on the relief precursor, said post-treatment being selected from the group comprising washing, brushing, rinsing, spraying, drying, irradiating, developing, heating, cooling, removing of material, treating with gases or liquids, sanding, cutting, treating with electromagnetic waves and combinations thereof. Also, the method may further comprise the step of performing a pre-treatment on the relief precursor, said pre-treatment being selected from the group comprising: cutting, ablation, exposure to electromagnetic radiation, and combinations thereof.

Preferably, the method further comprises decoupling the transport bar from the treated relief precursor in a plate decoupling station of the treatment apparatus. Preferably, the transport bar is moved in a closed loop from a plate coupling station through the treatment compartment to the plate decoupling station and back to the plate coupling station. Preferably, at least two transport bars are being transported simultaneously in the treatment compartment. In other words, the transport bar or bars can circulate automatically in the apparatus. An operator may bring the relief precursor to be treated to the plate coupling station, and next the coupling, treating and decoupling is performed automatically whereupon the transport bar is automatically returned to the plate coupling station. In that way an operator does not have to decouple or return the transport bar. This reduces the number of required manual interactions.

BRIEF DESCRIPTION OF THE FIGURES

The accompanying drawings are used to illustrate presently preferred non limiting exemplary embodiments of the apparatus and method of the present invention. The above and other advantages of the features and objects of the invention will become more apparent and the invention will be better understood from the following detailed description when read in conjunction with the accompanying drawings, in which.

DETAILED DESCRIPTION OF EMBODIMENTS

Figure 1:
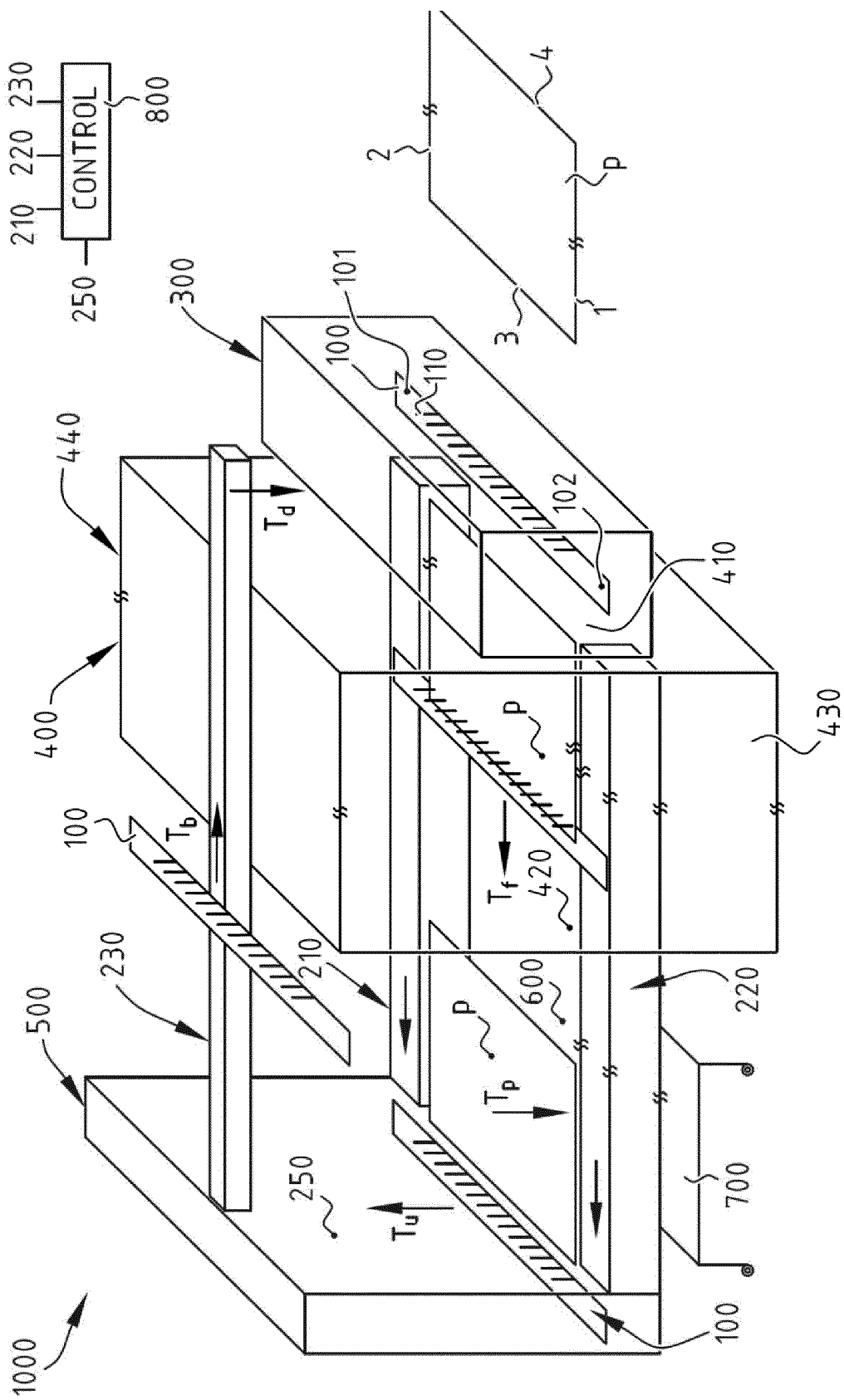
FIG. 1 is a schematic perspective view of an exemplary embodiment of an apparatus for treating a relief precursor.

FIG. 1 illustrates schematically an apparatus 1000 for treating a relief precursor, such as a printing plate precursor P. The apparatus is for instance a washing apparatus for washing a relief precursor with a liquid. However, also other treatments are possible such as brushing, rinsing, spraying, drying, irradiating, developing, heating, cooling, removing of material of the relief precursor, treating the relief precursor with gases or liquids, sanding the relief precursor, cutting the relief precursor, treating it with electromagnetic waves, or combinations thereof.

The apparatus 1000 comprises a transport system 210, 220, 230 with at least one, preferably at least two, and even more preferably at least three transport bars 100 intended to be coupled to a relief precursor. For example, four transport bars 100 may be provided to the transport system 210, 220, 230 as illustrated in FIG. 1. The transport bar 100 is coupled to a leading edge 3 of the relief precursor P and preferably extends over more than the entire length of the leading edge 3, such that end parts of the transport bar 100 can be coupled to a transport mechanism of the transport system 210, 220, see further. It is noted that it is also possible to couple a plurality of relief precursors to the transport bar 100. Preferably, the length of the transport bar 100 is between 100 mm and 1000 mm, more preferably between 1000 mm and 4000 mm.

The apparatus 1000 comprises a plate coupling station 300 configured for coupling a relief precursor P to a transport bar 100, a treatment compartment 400 configured for treating the relief precursor whilst the transport bar 100 to which the relief precursor P is coupled, is moved through the treatment compartment 400, and a plate decoupling station 500 configured for decoupling the treated relief precursor P from the transport bar 100. Preferably, the transport system 210, 220, 230 is configured to automatically move each transport bar 100, after being coupled to a relief precursor P in the plate coupling station 300, from the plate coupling station 300 through the treatment station 400 to the plate decoupling station 500, and, after being decoupled from a treated relief precursor P, from the plate decoupling station 500 back to the plate coupling station 300, such that the transport bar 100 moves in a closed loop through the apparatus 1000. In the illustrated example of FIG. 1, four transport bars 100 circulate in the apparatus 1000. However, the invention also cover embodiments where the transport bars are brought back manually from the plate decoupling station 500 t0 the plate coupling station 300.

Figure 6:
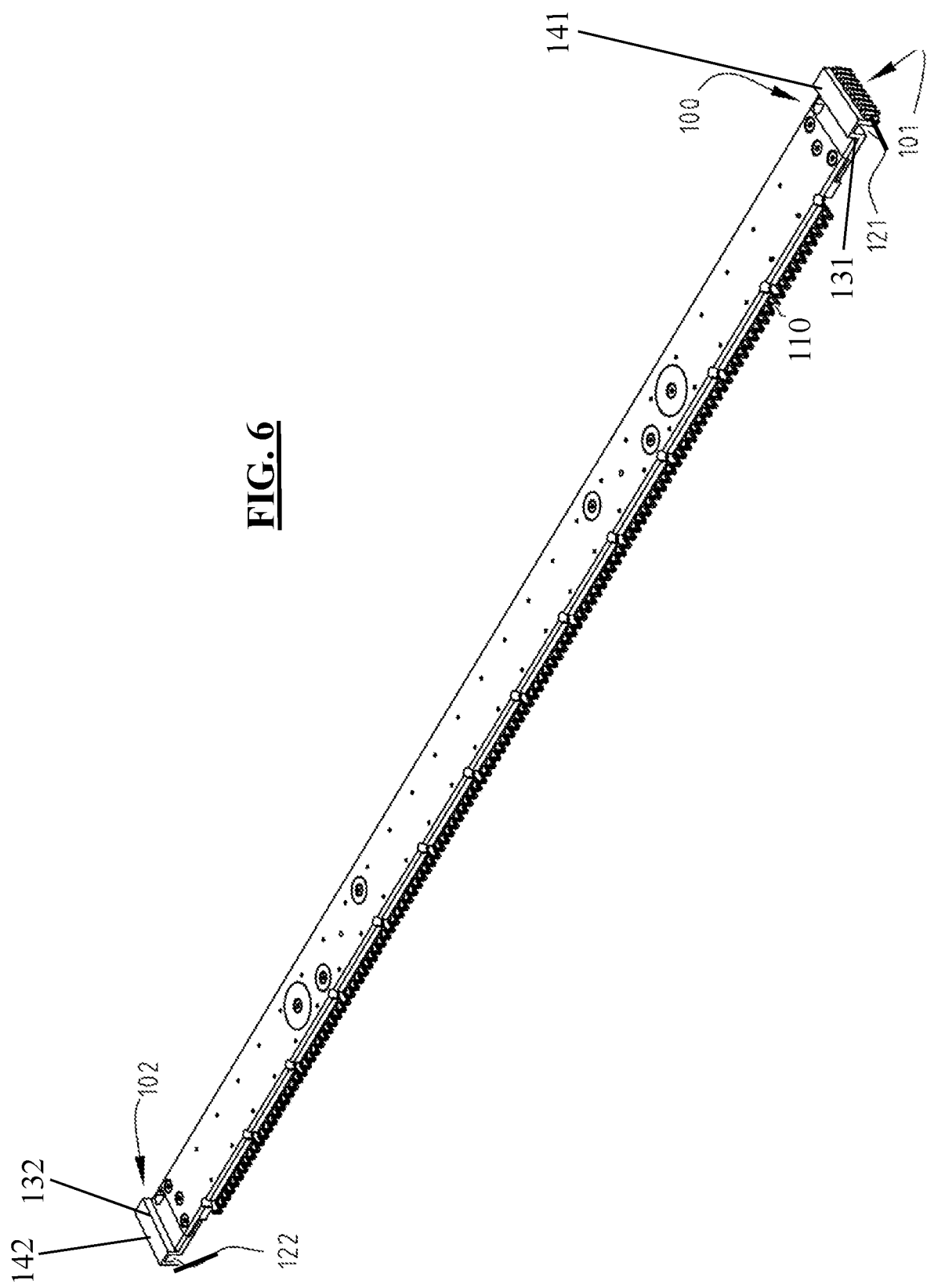
FIG. 6 is a schematic perspective view of an exemplary embodiment of a transport bar.

In a preferred embodiment, each transport bar 100 is provided with a plurality of penetration elements 110 (here in the form of pins or rods), and the plate coupling station 300 is configured to engage the plurality of penetration elements 110 in an area near the leading edge 3 of the relief precursor P. In FIG. 1, the relief precursor P has a leading edge 3, a trailing edge 4, both perpendicular to a forward transport direction Tf of the relief precursor P through the apparatus 1000, and two side edges 1, 2 parallel to the forward transport direction Tf. An area near the leading edge 3 of the relief precursor P is coupled to the plurality of penetration elements 110 of the transport bar 100. FIG. 6 illustrates a more detailed exemplary embodiment of a transport bar 100. The plurality of penetration elements 110 preferably have sharp tips, and the plate coupling station 300 is preferably configured to cause a penetration of the plurality of penetration elements 110 at least partially into or through an unperforated area near the leading edge 3 of the relief precursor P. However, it is noted that according to another exemplary embodiment, the apparatus 1000 of FIG. 1 may also be used with transport bars 100 which are provided with a plurality of penetration elements 110 which do not have a sharp tip. For example, the area near the leading edge 3 of the relief precursor P may be pre-perforated before bringing the relief precursor P to the plate coupling station 300, such that the plurality of penetration elements 110 can be arranged through pre-perforated holes in the area near the leading edge 3.

The treatment compartment 400 has an inlet side 410 and an outlet side 420. A transport bar 100 with a coupled relief precursor P is moved through the treatment compartment 400 from the inlet side 410 to the outlet side 420, wherein the transport bar 100 moves in the forward transport direction Tf. Between the outlet side 420 of the treatment compartment 400 and the plate decoupling station 500, there is provided a plate discharge zone 600. A relief precursor P is pulled by the transport system fully out of the treatment compartment 400 in the plate discharge zone 600 before being decoupled from the transport bar 100 in the decoupling station 500. In that way, when the relief precursor P is decoupled from the transport bar 100, the relief precursor P can be discharged in the plate discharge zone 600. At the bottom of the plate discharge zone 600 there may be provided a removal means configured to remove a treated relief precursor P after being decoupled from the transport bar 100 in the plate decoupling station 500. In the illustrated embodiment, the removal means 700 is a trolley configured for receiving the treated relief precursor P in the plate discharge zone 600, and for being moved out of the plate discharge zone 600, such that it can be easily transported away of the plate discharge zone. For example, if the apparatus 1000 is a washer, an operator may transport the washed relief precursor P to a dryer in order to dry the washed relief precursor. In other non illustrated embodiments, the removal means 700 may be a carrier, a robot, a moving belt, at least one rotating drum, etc. Also such devices can be configured to move a treated relief precursor P out of the plate discharge zone 600 after being decoupled in the plate decoupling station 500.

Figure 7:
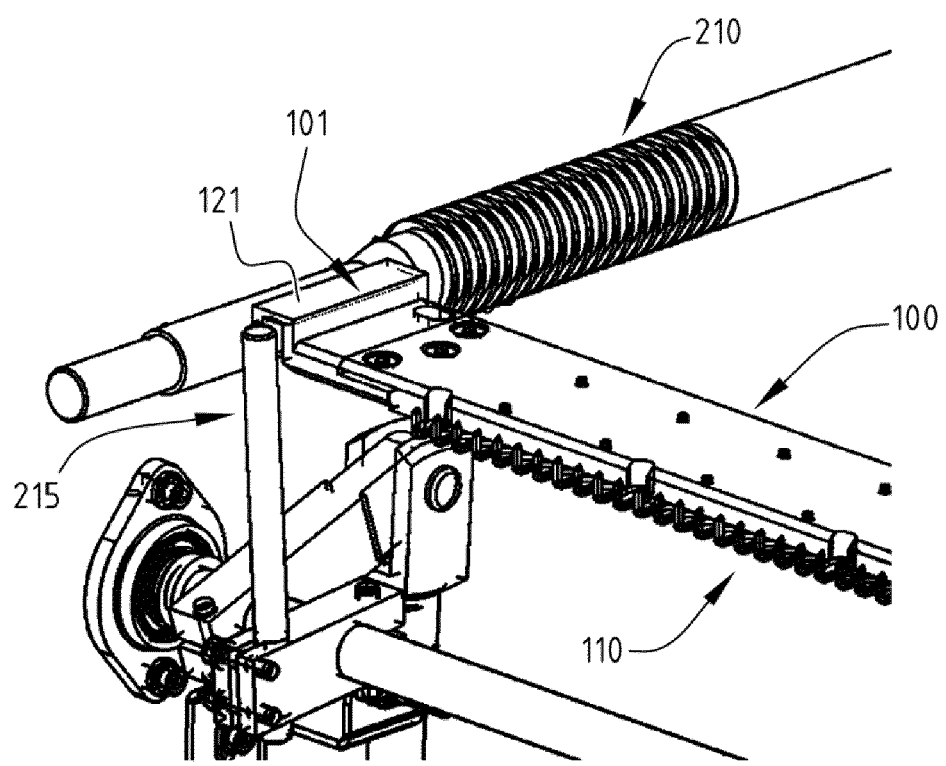
FIG. 7 is a detailed perspective view illustrating a portion of an exemplary embodiment of a plate coupling station.

In the embodiment of FIG. 1, the transport system comprises a forward transport mechanism which comprises first transport mechanism 210 on one side of the apparatus 1000, and a second transport mechanism 220 on the other side of the apparatus 1000. The transport mechanism 210, 220 is configured to transport the transport bar 100 with a coupled relief precursor P at least from the inlet side 410 to the outlet side 420 of the treatment compartment 400, and optionally from the outlet side 420 to the plate decoupling station 500, in the forward transport direction Tf. To that end, a first outer end 101 of the transport bar 100 is coupled with the first forward transport mechanism 210, and a second outer end 102 of the transport bar 100 is coupled with the second forward transport mechanism 220. As illustrated in FIG. 7, the transport system 210 may comprise a bar coupling means 215 configured to couple the transport bar 100, and more in particular the first outer end 101 and the second outer end 102 of the transport bar to the first and second forward transport mechanism 210, 220. Only the first outer end 101 and the first transport mechanism are shown in FIG. 7, but it is understood that the second outer end 102 and the second transport mechanism 220 may be embodied in a similar manner. The bar coupling means 215 may be configured e.g. for pushing or moving the transport bar 100 in the direction of the first and second forward transport mechanism, in order to cause a coupling of the outer ends 101 and 102 of the transport bar 100 to the forward transport mechanism 210, 220. In the embodiment of FIG. 1, the treatment compartment 400 has a first and second opposite lateral side 430, 440 extending in the forward transport direction Tf, and the first and second forward transport mechanism 210, 220 extend at the first and second opposite lateral side 430, 440 of the treatment compartment 400, respectively.

The transport system further comprises a backward transport mechanism 230 configured to transport the transport bar 100 from the plate decoupling station 500 back to the plate coupling station 300. In the illustrated embodiment of FIG. 1, the backward transport mechanism 230 is located at an upper side of the apparatus 1000. However, in other embodiments, the backward transport mechanism 230 could be arranged in a lower portion of the apparatus 1000, below the forward transport mechanism 210, 220. A backward transport mechanism 230 may comprise any one of the following: one or more belts, one or more chains, one or more lead screws, a linear motor, or combinations thereof. In FIG. 1, the backward transport mechanism 230 is arranged centrally above the treatment compartment 400. However, the backward transport mechanism 230 could also be realized with a first and second backward transport mechanism located at opposite lateral sides of the treatment compartment 400 above or below the first and second forward transport mechanism 210, 220. Alternatively, the backward transport mechanism may be located at a lateral side of the treatment compartment, and optionally the transport bar may be rotated and transported backward in a vertical position. However, in order to reduce the footprint of the apparatus the backward transport mechanism is preferably located above or below the first and second forward transport mechanism 210, 220. As illustrated in FIG. 1, the backward transport mechanism 230 is located partly above the treatment compartment 400, and the transport system further comprises an upward transport mechanism 250 configured to move a decoupled transport bar 100 in the plate decoupling station 500 upward towards the backward transport mechanism 230. For example, the upward transport mechanism 250 may move the transport bar 100 in an upward direction Tu, typically a vertical direction, towards the backward transport mechanism 230 which moves the transport bar 100 in a backward transport direction Tb opposite to the forward transport direction Tf, back to the plate coupling station 300. The upward transport mechanism 250 may comprise any one or more of the following: magnetic means, electromagnetic means, clamping means, vacuum means, linear motors, chains, belts, lead screws, piston or combinations thereof. In other embodiments where the backward transport mechanism 230 is located below the forward transport mechanism, there may be provided a downward transport mechanism. The downward transport mechanism may comprise any one or more of the following: magnetic means, electromagnetic means, clamping means, vacuum means, linear motors, chains, belts, lead screws, piston or combinations thereof, or occur simply by gravity.

FIG. 6 illustrates a more detailed exemplary embodiment of a transport bar 100. The transport bar 100 is provided with a first coupling portion 121 and a second coupling portion 122 at the first outer end 101 and the second outer end 102. In this case the coupling portions 121, 122 are configured with coupling means to be used in combination with a lead screw. The transport bar 100 is provided with penetration elements 110. The transport bar 100 is equipped with channels 120 allowing alignment pins to pass through the transport bar 100 from below the transport bar.

As illustrated in FIG. 6, in an exemplary embodiment, the first forward transport mechanism 210 comprises a first lead screw, and the first coupling portion 121 is configured to be coupled to the first lead screw 210. In a similar manner, the second forward transport mechanism 220 may be provided with a second lead screw which can be coupled to the second coupling portion 122. In other embodiments, the first and/or second forward transport mechanism 210, 220 may comprise other transport means such as a chain or belt, and the first and second coupling portions 121, 122 may be adapted accordingly.

Figure 2:
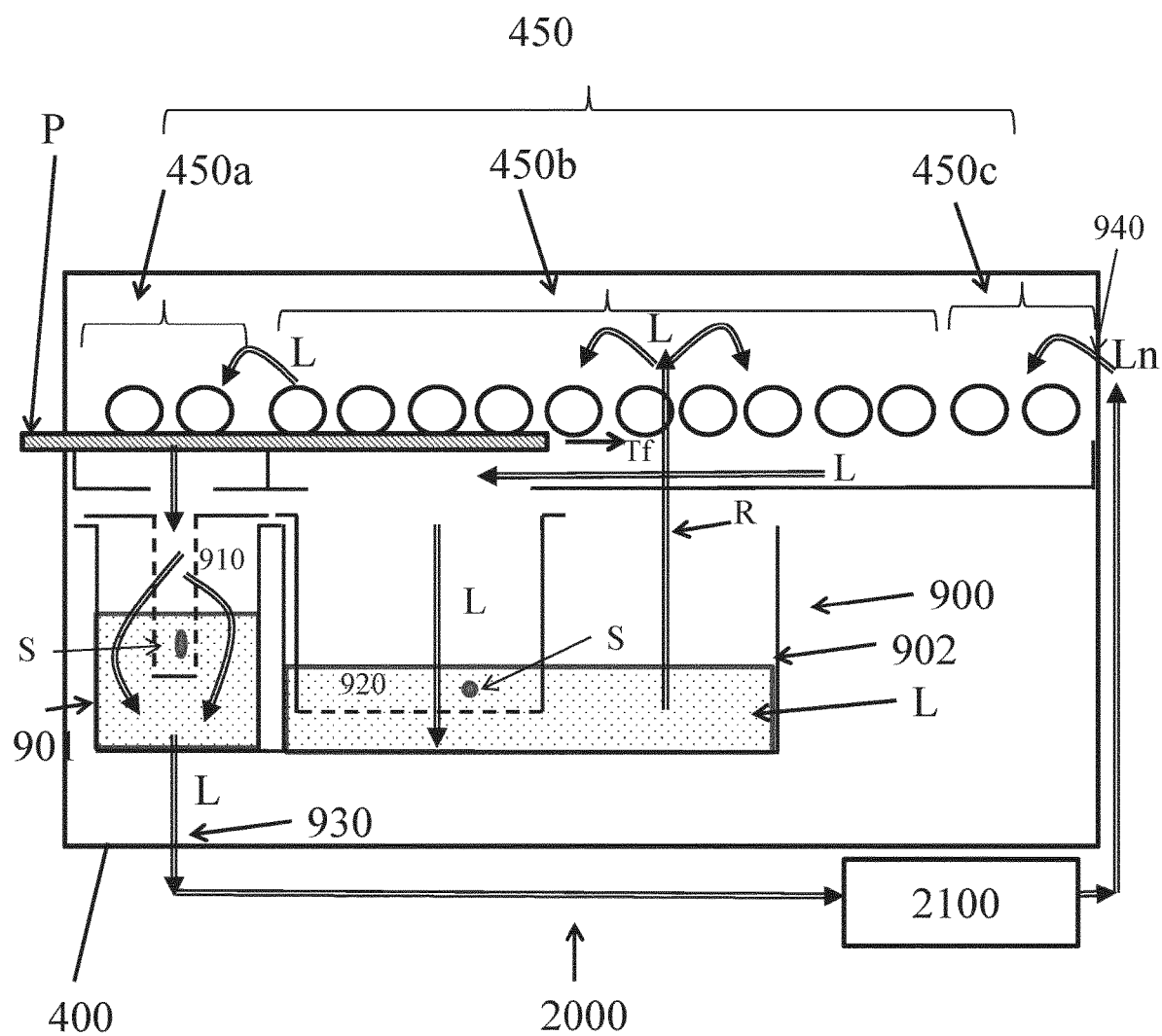
FIG. 2 is a schematic side view of an exemplary embodiment of an apparatus for treating a relief precursor.
Figure 3:
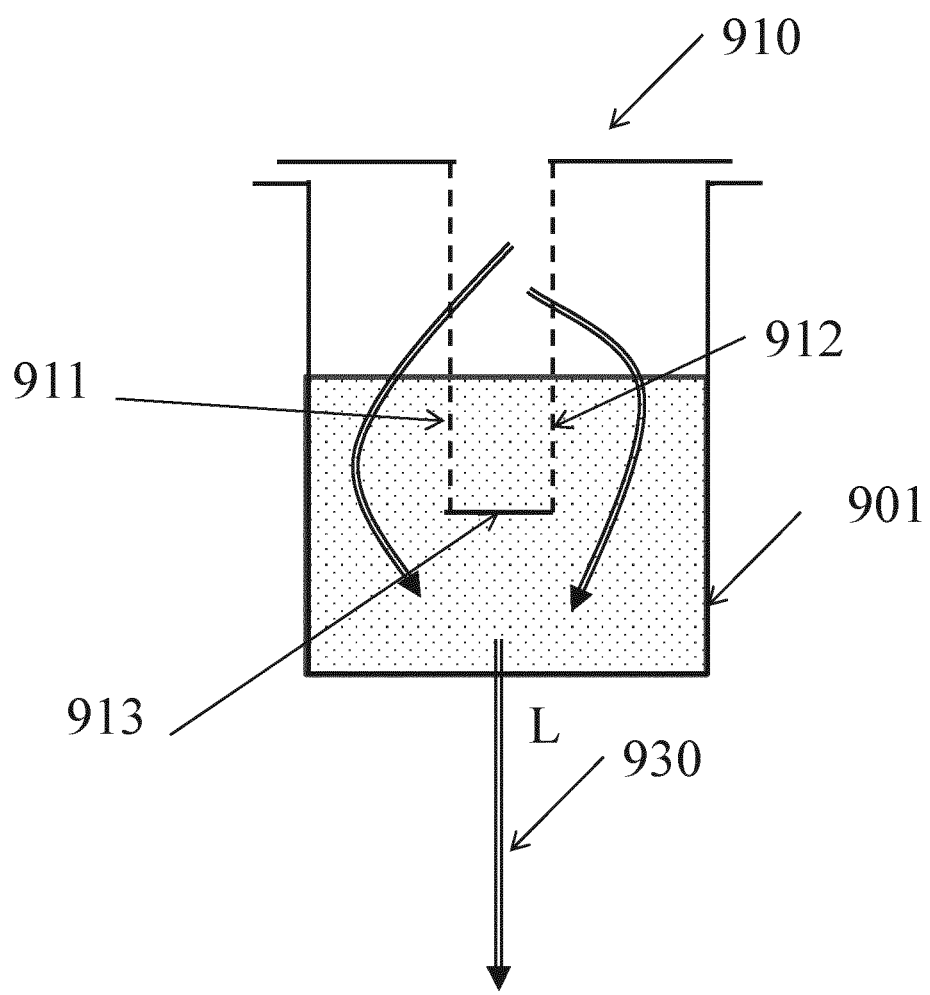
FIG. 3 is a detailed schematic view of the first sieve means of the embodiment of FIG. 2.
Figure 4:
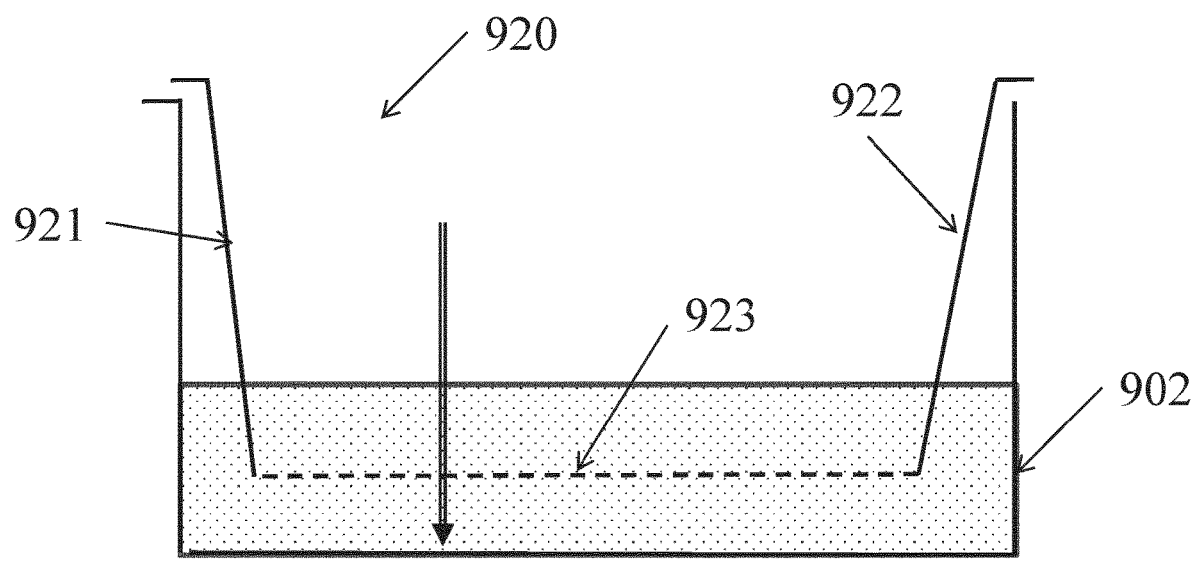
FIG. 4 is a detailed schematic view of the second sieve means of the embodiment of FIG. 2.

FIGS. 2, 3 and 4 illustrate in detail an exemplary embodiment of an apparatus 1000 for treating a relief precursor P with a liquid L. The apparatus 100 comprises a treatment compartment 400 with a treatment means 450 comprising a plurality of liquid application rollers 450a, 450b, 450c. A transport system (not shown in FIG. 2) similar to the transport system illustrated in FIG. 1 may be used to move a transport bar (not shown) with a coupled relief precursor P through the treatment compartment 400 in a direction Tf. The treatment means 450 is configured to treat a relief precursor P with a liquid L and to remove pieces from the relief precursor P. The apparatus further comprises a liquid collection system 900 configured to receive liquid and pieces S from the treatment means 450. Only two pieces S are shown in a schematic way but the skilled person understands that many more pieces will be present. The liquid collection system 900 is further configured to separate pieces S having dimensions larger than predefined minimum dimensions from the liquid L. The pieces S may comprise e.g. cured and/or non-cured particles, residues, film portions, flocs, gel-like pieces, etc., but may also comprise any other undesirable part such as a screw or a nut or a bristle. The liquid collection system 900 is further configured to allow at least some of said pieces S to be dissolved at least partially in the liquid L, not only during treatment but also when the liquid L is in a static state after or before a treatment of the relief precursor P with the treatment means 450, i.e. both when the treatment means 450 are operational and non-operational. Screws will not be dissolved, but especially non-cured particles, polymer particles and other pieces removed from the relief precursor may be dissolved. Preferably, as illustrated in FIG. 2, the liquid collection system 900 is configured to maintain a majority of the separated pieces S in a submerged state in the liquid L, both when the treatment means 450 are operational and non-operational.

The treatment means 450 comprises one or more pre-washing members 450a, one or more main washing members 450b downstream of the pre-washing members 450a, and one or more cleaning members 450c, downstream of the main washing members 450b. It is noted that in other embodiments of the invention only pre-washing members 450a and/or main washing members 450b may be provided.

The liquid collection system 900 comprises a first sieve means 910 removably arranged in a first container 901 receiving liquid used by the pre-washing members 450a and a second sieve means 920 removably arranged in a second container 902 receiving liquid used by the main washing members 450b. In other embodiments only one sieve means or more than two sieve means may be provided. In the example of FIG. 2, both the first sieve means 910 and the second sieve means are at least partially submerged in the liquid. However, in other embodiments only the first sieve means or only the second sieve means may be at least partially submerged in the liquid both during and after treatment. In yet another embodiment, the sieve means are not submerged in a static state of the liquid as will be further explained in connection with the example of FIG. 5. The first container 901 may have a volume larger than 20 litre, or even larger than 30 litre, e.g. between 35 litre and 100 litre. The second container 902 may have a volume larger than 50 litre, or larger than 100 litre or even larger than 200 litre, e.g. between 200 and 600 litre.

The liquid collection system 900 is further configured for carrying liquid L that has passed through the first sieve means 910 into the first container 901, to an outlet 930 and for recirculating liquid that has passed through the second sieve means 920 into the second container 902 directly to the treatment means 450, see arrow R.

The apparatus further comprises liquid transport means (not shown), such as a pump or suction means, configured to cause, a first flow of at least 0.3 litre per minute, preferably at least 0.6 litre per minute through the first sieve means and a second flow of at least 10 litre per minute, preferably at least 30 litre per minute through the second sieve means. Thus, the pre-washing uses a much slower first flow compared to the faster second flow used for the main-washing.

Preferably, the liquid collection system 900 is part of a liquid circulation system configured to circulate the collected liquid back to the treatment means 450. In the example of FIG. 2, the liquid used for the pre-washing is recirculated directly to the treatment means 450 without being cleaned or otherwise treated, whilst the liquid used for the main washing is sent to a separate device 2100 for being cleaned or otherwise treated, e.g. a distillation apparatus, before being returned to an inlet 940 of the treatment compartment 400, as fresh liquid Ln. This inlet 940 is arranged such that the fresh liquid Ln is used by the one or more cleaning members 450c.

As shown in FIG. 3, the first sieve means 910 is integrated in a basket with a closed bottom portion 913 and a peripheral portion 911, 912 forming the sieve means 910. In an alterative embodiment, the bottom portion 913 may also be a sieve surface. The peripheral sieve portions 911, 912 are oriented at an angle of at least 30° with respect to a horizontal direction, and preferably substantially vertically as shown in FIG. 3. In that manner any pieces S stopped by the sieve portions 911, 912 can fall downward in the liquid L.

As shown in FIG. 4, the second sieve means 920 is also integrated in a basket, but here the basket has a sieve bottom portion 923 and a closed peripheral portion 921, 922. The peripheral portions 911, 912 are oriented at an angle of at least 30° with respect to a horizontal direction. In that manner any pieces S stopped by the peripheral portions 921, 922 can fall downward in the liquid L.

Figure 5:
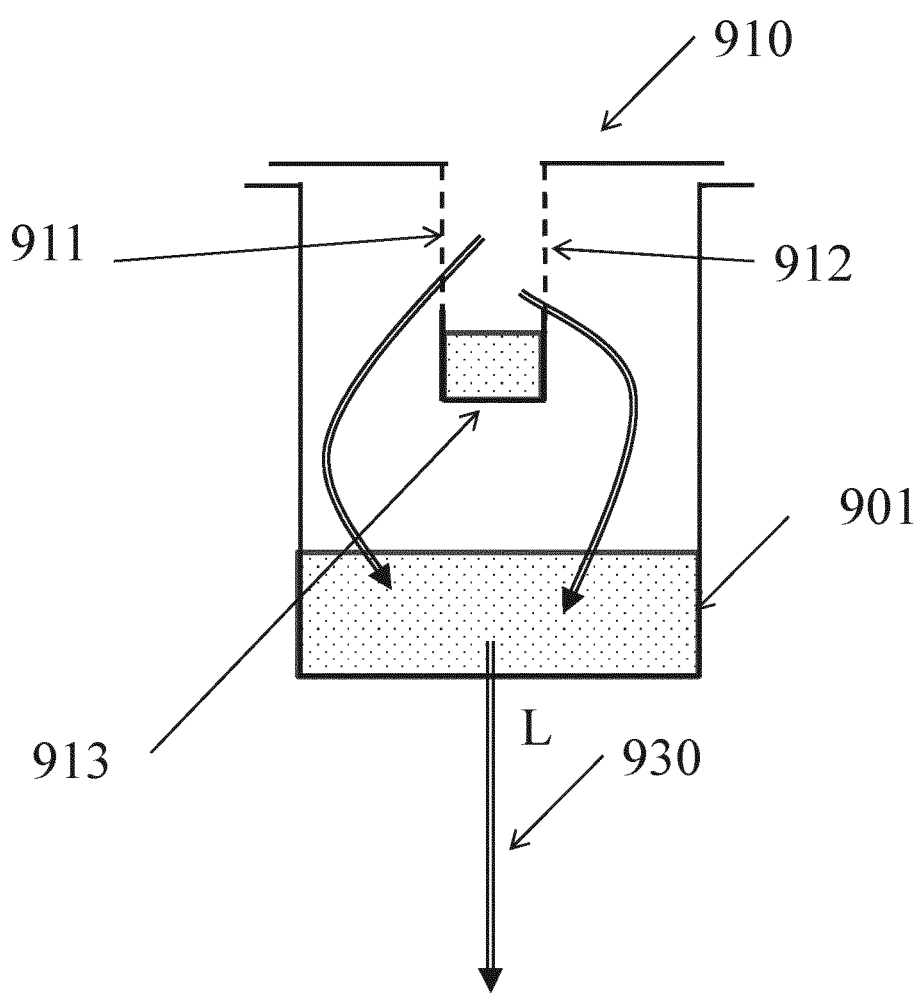
FIG. 5 is a detailed schematic view of another exemplary embodiment of sieve means.

FIG. 5 shows a variant of the embodiment of FIG. 3. In FIG. 5, the sieve means 910 is integrated in a basket with a closed bottom tray 913 configured for holding an amount of liquid and a peripheral portion 911, 912 forming the sieve means 910. The peripheral sieve portions 911, 912 are oriented at an angle of at least 30° with respect to a horizontal direction, and preferably substantially vertically as shown in FIG. 3. In that manner any pieces S stopped by the sieve portions 911, 912 can fall downward in the liquid L in the bottom tray 913. In this way the sieve portions 911 and 912 do not have to be submerged in the liquid L, whilst still allowing that any pieces S are dissolved in the liquid L in the bottom tray 913.

The sieve means 910, 920 may comprise any one or more of: a wire mesh, a grid of a material stable in the liquid, a plate with a plurality of holes. The sieve means 910, 920 may have openings with dimensions in the range smaller than 5 mm, preferably 0.1 mm to 3 mm, more preferably 0.5 mm to 2 mm.

Preferably, the sieve means 910, 920 is removable. In the embodiments of FIGS. 2, 3, 4 and 5, the sieve means is integrated in a basket and the basket is removable. In that manner, the basket can be removed for cleaning.

Preferably, the sieve means 910, 920 is made of a metal, an alloy, a plastic, a glass, a ceramic, natural fibres or combinations thereof. Preferably the sieve means is made from a woven or nonwoven form of fibres, filaments or wires, and preferably from a material which is configured not to absorb or adsorb the pieces S. Preferably, the sieve means 910, 920 is configured to hold back pieces having a largest dimension larger than 5 mm, preferably larger than 3 mm, more preferably larger than 2 mm.

In the embodiment of FIG. 1, the treatment compartment 400 of FIG. 2 may be implemented. The plurality of liquid application rollers 450a, 450b, 450c may be arranged with their axis parallel to the transport bar 100. The first and second transport mechanism 210, 220 extend perpendicular on the axis A of the liquid application rollers 450a, 450b, 450c, at a first and second side of the liquid application rollers, respectively.

A relief precursor generally comprises a support layer made of a first material and an additional layer made of a second material which is different from said first material. The support layer may be a flexible metal, a natural or artificial polymer, paper or combinations thereof. Preferably the support layer is a flexible metal or polymer film or sheet. In case of a flexible metal, the support layer could comprise a thin film, a sieve like structure, a mesh like structure, a woven or non-woven structure or a combination thereof. Steel, copper, nickel or aluminium sheets are preferred and may be about 50 to 1000 µm thick. In case of a polymer film, the film is dimensionally stable but bendable and may be made for example from polyalkylenes, polyesters, polyethylene terephthalate, polybutylene terephthalate, polyamides and polycarbonates, polymers reinforced with woven, non-woven or layered fibres (e.g. glass fibres, Carbon fibres, polymer fibres) or combinations thereof. Preferably polyethylene and polyester foils are used and their thickness may be in the range of about 100 to 300 µm, preferably in the range of 100 to 200 µm.

A relief precursor may carry at least one additional layer. For example, the additional layer may be any one of the following: a direct engravable layer (e.g. by laser), a solvent or water developable layer, a thermally developable layer, a photosensitive layer, a combination of a photosensitive layer and a mask layer. Optionally there may be provided one or more further additional layers on top of additional layer. Such one or more further additional layers may comprise a cover layer at the top of all other layers which is removed before the imageable layer is imaged. The one or more additional layers may comprise a relief layer, and an anti-halation layer between the support layer and the relief layer or at a side of the support layer which is opposite of the relief layer. The one or more additional layers may comprise a relief layer, an imageable layer, and one or more barrier layers between the relief layer and the imageable layer which prevent diffusion of oxygen. Between the different layers described above one or more adhesion layers may be located which ensure proper adhesion of the different layers.

In a preferred embodiment the relief precursor comprises a support layer made of a polyester of polymer material, and an additional layer made of a directly engravable material such as a resin material. The optional layer may then be a laser ablative layer. In an exemplary embodiment the relief precursor may contain at least a dimensionally stable support layer, a relief layer and an imageable mask layer. Optionally, further layers may be present. There may be a cover layer at the top of all other layers which is removed before the imageable mask layer is imaged. There may be an anti-halation layer between the support layer and the relief layer or it may be located at the side of the support layer which is opposite of the relief layer. There may be one or more barrier layers between the relief layer and the imageable mask layer which prevent diffusion of oxygen. Between the different layers described above one or more adhesion layers may be located which ensure proper adhesion of the different layers. One or more layers may be removable by treatment with a liquid. The liquids used may be the same or different for different layers. Preferably the liquids used are different.

In a preferred embodiment the relief precursor comprises a photosensitive layer and a mask layer. The mask layer may be ablated or changed in transparency during the treatment and forms a mask with transparent and non-transparent areas. Preferably the mask layer and/or the barrier layer are removed in the pre-washing section of the apparatus because they may comprise material which could cause problems in further process steps or during use of the final relief. Underneath of transparent areas of the mask the photosensitive layer undergoes a change in solubility and/or fluidity upon irradiation. The change is used to generate the relief by removing parts of the photosensitive layer in one or more subsequent steps. The change in solubility and/or fluidity may be achieved by photo-induced polymerization and/or crosslinking, rendering the irradiated areas less soluble. In other cases the electromagnetic radiation may cause breaking of bonds or cleavage of protective groups rendering the irradiated areas more soluble. Preferably a process using photo-induced crosslinking and/or polymerization is used.

Liquids which may be used in embodiments of the invention include amongst others: water, aqueous solutions, solvents and combinations thereof. The nature of the liquid used is guided by the nature of the precursor employed. If the layer to be removed is soluble, emulsifiable or dispersible in water or aqueous solutions, water or aqueous solutions might be used. If the layer is soluble, emulsifiable or dispersible in organic solvents or mixtures, organic solvents or mixtures may be used. In the case of organically developable precursors different organic solvents or their mixtures may be used.

The liquids may be water or aqueous solutions which may contain other ingredients e.g. salts, acids, bases, emulsifiers, dispersion aids, viscosity regulators, surfactants or combinations thereof. Salts, acids and bases may be used to control the pH of the liquid. Emulsifiers and dispersion aids may be used to enhance the capacity of material uptake of the liquids and stabilize such emulsions and dispersions. The aqueous solutions may comprise organic solvents, e.g. alcohols, esters, ethers; or hydrocarbons or combinations thereof.

The liquids may be organic solvents or mixtures thereof. For example, use may be made of developers comprising naphthenic or aromatic petroleum fractions in a mixture with alcohols, such as benzyl alcohol, cyclohexanol, or aliphatic alcohols having 5 to 10 carbon atoms, for example, and also, optionally, further components, such as, for example, alicyclic hydrocarbons, terpenoid hydrocarbons, substituted benzenes such as diisopropylbenzene, esters having 5 to 12 carbon atoms, or glycol ethers or water. Suitable washing agents are disclosed in EP-A 332 070 or EP-A 433 374, for example. In addition the solvents and solvent mixtures may comprise other ingredients e.g. salts, acids, bases, emulsifiers, dispersion aids, viscosity regulators, antistatics, water, surfactants or combinations thereof. Preferably liquids with organic solvents should have a high flash point, preferably above 60° C. For reasons of safety and to reduce the cost and complexity of the apparatus involved, the temperature when using organic solvents ought to be 5° C. to 15° C. beneath the flash point of the washing agent mixture used.

Whilst the principles of the invention have been set out above in connection with specific embodiments, it is to be understood that this description is merely made by way of example and not as a limitation of the scope of protection which is determined by the appended claims.

The invention claimed is:

1. An apparatus for treating a relief precursor, such as a printing plate precursor, with a liquid, comprising:
   a treatment compartment with treatment means configured to treat a relief plate precursor with a liquid and to remove pieces from the relief precursor;
   a liquid collection system configured to receive liquid and removed pieces from the treatment means; wherein the liquid collection system is configured to separate pieces having dimensions larger than predefined minimum dimensions from the liquid and to allow at least some of said separated pieces to be dissolved at least partially in the liquid at least when the liquid is in a static state after or before a treatment of the relief precursor with the treatment means.

2. The apparatus according to claim 1, wherein the liquid collection system is configured to maintain a majority of the separated pieces in a state wetted with the liquid, both when the treatment means are operational and non-operational.

3. The apparatus according to claim 1, wherein the liquid collection system is configured to maintain a majority of the separated pieces in a submerged state in the liquid, both when the treatment means are operational and non-operational.

4. The apparatus according to claim 1, wherein the liquid collection system is part of a liquid circulation system configured to circulate the collected liquid back to the treatment means.

5. The apparatus according to claim 1, wherein the liquid collection system comprises a sieve means; and wherein preferably the sieve means is at least partially submerged in the liquid.

6. The apparatus according to claim 5, wherein the liquid collection system comprises a container for storing the sieved liquid, and wherein the sieve means is arranged in the container so that it is submerged at least when the liquid is in a static state after or before a treatment of the relief precursor with the treatment means.

7. The apparatus according to claim 5, wherein the sieve means comprises a sieve plane oriented at an angle of at least 30° with respect to a horizontal direction, preferably vertically.

8. The apparatus according to claim 5, wherein the sieve means comprises any one or more of: a wire mesh, a grid, a plate with a plurality of holes; wherein the sieve means is made of a material stable in the liquid; wherein preferably the sieve means have openings with dimensions in the range smaller than 5 mm, more preferably 0.1 mm to 3 mm, even more preferably 0.5 mm to 2 mm.

9. The apparatus according to claim 5, wherein the sieve means is integrated in a basket; and wherein the basket has a closed bottom tray configured for holding an amount of liquid, and a peripheral portion forming the sieve means.

10. The apparatus according to claim 5, wherein the sieve means is removable; and/or wherein the sieve means is made of a metal, an alloy, a plastic, a glass, a ceramic, natural fibers or combinations thereof.

11. The apparatus according to claim 1, wherein the liquid collection system is configured not to absorb or adsorb the pieces.

12. The apparatus according to claim 5, wherein the sieve means is configured to hold back pieces having a largest dimension larger than 5 mm, preferably larger than 3 mm, more preferably larger than 2 mm.

13. The apparatus according to claim 5, wherein the treatment means comprises one or more pre-washing members and one or more main washing members downstream of the pre-washing members, and wherein the sieve means comprises a first sieve means receiving liquid used by the pre-washing members and a second sieve means receiving liquid used by the main washing members; wherein preferably the first and/or the second sieve means is at least partially submerged in the liquid, and wherein preferably at least the first sieve means is at least partially submerged in the liquid both during and after treatment.

14. The apparatus of claim 13, wherein the liquid collection system is further configured for carrying liquid that has passed through the first sieve means to an outlet and for recirculating liquid that has passed through the second sieve means directly to the treatment means; preferably further comprising liquid transport means configured to cause, a flow of at least 0.3 liters per minute, preferably at least 0.6 liters per minute through the first sieve means and a flow of at least 10 liters per minute, preferably at least 30 liters per minute through the second sieve means.

15. The apparatus of claim 13, wherein the treatment means further comprises one or more cleaning members downstream of the one or more main washing members; and wherein preferably the treatment compartment is provided with an inlet for fresh liquid which is arranged such that the fresh liquid is used by the one or more cleaning members.

16. The apparatus according to claim 1, further comprising a transport system configured to move the relief plate precursor through the treatment compartment; wherein optionally the transport system comprises at least one transport bar provided with a coupling portion configured to be coupled to the relief plate precursor and wherein the transport system is configured to transport the transport bar through the treatment compartment.

17. The apparatus according to claim 16, wherein the coupling portion of the transport bar comprises at least one penetration element, preferably a plurality of penetration elements; and/or wherein the transport system comprises any one of the following: one or more lead screws, preferably a pair of lead screws, one or more chains or belts, preferably a pair of chains or belts.

18. A method for treating a relief precursor with a liquid, comprising the steps of
   treating a relief precursor with a liquid and to remove pieces from the relief precursor;
   collecting liquid and removed pieces and separating pieces having dimensions larger than predefined minimum dimensions from the liquid and allowing at least some of said separated pieces to be dissolved at least partially in the liquid at least after the treating.

19. The method according to claim 18, wherein a majority of the separated pieces is maintained in a state wetted with the liquid, both during treatment and after treatment.

20. The method according to claim 18, wherein a majority of the separated pieces is maintained in a submerged state in the liquid, both during treatment and after treatment; wherein optionally a sieve means is used for the separating and the separated pieces are not absorbed or adsorbed on the sieve means; and wherein preferably the sieve means is arranged in a container for storing the sieved liquid so that the sieve means is submerged at least when the liquid is in a static state after or before the treating of the relief precursor.

21. The method according to claim 18, wherein the treating comprises a pre-washing step followed by a main washing step; wherein optionally liquid used during the pre-washing step is sent through a first sieve means which is at least partially submerged in the liquid during and after the pre-washing step; wherein optionally the liquid used during the pre-washing step is carried to an outlet and wherein the liquid used for the main washing step is recirculated and used for the treating step; wherein optionally the treating further comprises a cleaning step after the main washing step using fresh liquid (Ln); and wherein preferably the treatment during the treating step is selected from the group comprising washing, brushing, rinsing, spraying, developing, heating, cooling, removing of material, treating with gases or liquids, treating with electromagnetic waves, and combinations thereof.

* * * * *